(12) United States Patent  
Hayworth et al.

(10) Patent No.: US 7,285,844 B2
(45) Date of Patent: Oct. 23, 2007

(54) MULTIPLE INTERNAL SEAL RIGHT MICRO-ELECTRO-MECHANICAL SYSTEM VACUUM PACKAGE

(75) Inventors: Ken J. Hayworth, Northridge, CA (US); Karl Y. Yee, Pasadena, CA (US); Kirill V. Shcheglov, Los Angeles, CA (US); Youngsam Bae, Gardena, CA (US); Dean V. Wiberg, La Crescenta, CA (US); A. Dorian Challoner, Manhattan Beach, CA (US); Chris S. Peay, Alhambra, CA (US)

(73) Assignees: California Institute of Technology, Pasadena, CA (US); The Boeing Company, Chicago, IL (US)

( * ) Notice: Subject to any disclaimer, the term of this patent is extended or adjusted under 35 U.S.C. 154(b) by 339 days.

(21) Appl. No.: 10/865,344

(22) Filed: Jun. 10, 2004

(65) Prior Publication Data

US 2005/0017329 A1    Jan. 27, 2005

Related U.S. Application Data

(60) Provisional application No. 60/477,463, filed on Jun. 10, 2003.

(51) Int. Cl.
*H01L 23/552* (2006.01)
(52) U.S. Cl. .................. 257/659; 257/660; 438/455; 438/456; 216/2
(58) Field of Classification Search .............. 257/659, 257/660; 438/455, 456; 216/2
See application file for complete search history.

(56) References Cited

U.S. PATENT DOCUMENTS 392,650 A    11/1888 Watrous 4,898,031 A    2/1990 Oikawa et al.
5,203,208 A    4/1993 Bernstein
5,226,321 A    7/1993 Varnham et al.

(Continued)

FOREIGN PATENT DOCUMENTS

DE    44 42 033 A1    5/1996

(Continued)

OTHER PUBLICATIONS

Barbour, N. et al., "Micromechanical Silicon Instrument and Systems Development at Draper Laboratory," 1996, ALAA Guidance, Navigation and Control Conference, 1-7.

(Continued)

*Primary Examiner*—Shamim Ahmed
(74) *Attorney, Agent, or Firm*—Canady & Lortz LLP; Bradley K. Lortz

(57) ABSTRACT

A Multiple Internal Seal Ring (MISR) Micro-Electro-Mechanical System (MEMS) vacuum package that hermetically seals MEMS devices using MISR. The method bonds a capping plate having metal seal rings to a base plate having metal seal rings by wafer bonding the capping plate wafer to the base plate wafer. Bulk electrodes may be used to provide conductive paths between the seal rings on the base plate and the capping plate. All seals are made using only metal-to-metal seal rings deposited on the polished surfaces of the base plate and capping plate wafers. However, multiple electrical feed-through metal traces are provided by fabricating via holes through the capping plate for electrical connection from the outside of the package through the via-holes to the inside of the package. Each metal seal ring serves the dual purposes of hermetic sealing and providing the electrical feed-through metal trace.

15 Claims, 10 Drawing Sheets

U.S. PATENT DOCUMENTS

| | | | |
|---|---|---|---|
| 5,421,312 A | 6/1995 | Dawson | |
| 5,507,080 A * | 4/1996 | Hayashi et al. | 29/25.41 |
| 5,578,976 A | 11/1996 | Yao et al. | |
| 5,646,346 A | 7/1997 | Okada | |
| 5,665,915 A | 9/1997 | Kobayashi et al. | |
| 5,728,936 A | 3/1998 | Lutz | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 5,987,985 A | 11/1999 | Okada | |
| 6,009,751 A | 1/2000 | Ljung | |
| 6,044,705 A | 4/2000 | Neukermans et al. | |
| 6,145,380 A | 11/2000 | Macgugan et al. | |
| 6,151,964 A | 11/2000 | Nakajima | |
| 6,164,134 A | 12/2000 | Cargille | |
| 6,182,352 B1 | 2/2001 | Deschenes et al. | |
| 6,257,057 B1 * | 7/2001 | Hulsing, II | 73/504.04 |
| 6,263,552 B1 | 7/2001 | Takeuchi et al. | |
| 6,282,958 B1 | 9/2001 | Fell et al. | |
| 6,289,733 B1 | 9/2001 | Challoner et al. | |
| 6,628,177 B2 | 12/2001 | Goudal | |
| 6,367,786 B1 | 4/2002 | Gutierrez et al. | |
| 6,479,320 B1 * | 11/2002 | Gooch | 438/109 |
| 6,481,284 B2 | 11/2002 | Geen et al. | |
| 6,481,285 B1 | 11/2002 | Shkel et al. | |
| 6,515,278 B2 | 2/2003 | Wine et al. | |
| 6,629,460 B2 | 10/2003 | Challoner | |
| 6,856,217 B1 | 2/2005 | Clark et al. | |
| 6,985,051 B2 | 1/2006 | Nguyen et al. | |
| 2002/0066317 A1 | 6/2002 | Lin | |
| 2003/0010123 A1 | 1/2003 | Malvern et al. | |
| 2003/0029238 A1 | 2/2003 | Challoner | |
| 2004/0055380 A1 | 3/2004 | Shcheglov et al. | |

FOREIGN PATENT DOCUMENTS

| | | |
|---|---|---|
| DE | 19719601 A1 | 11/1998 |
| EP | 0 461 761 A1 | 12/1991 |
| EP | 0461761 A1 | 12/1991 |
| EP | 0971208 A2 | 1/2000 |
| EP | 1055908 A1 | 11/2000 |
| EP | 0 971 208 A2 | 12/2000 |
| JP | 01129517 A | 5/1989 |
| JP | 401129517 A | 5/1989 |
| WO | WO96/38710 | 12/1996 |
| WO | WO98/15799 | 4/1998 |
| WO | WO 00/68640 | 11/2000 |
| WO | WO 01/44823 A | 6/2001 |
| WO | WO 01/74708 A | 10/2001 |

OTHER PUBLICATIONS

Fujita, T. et al., "Disk-shaped bulk micromachined gyroscope with vacuum sealing," 2000, Sensors and Actuators, 82:198-204.

Johnson, J.D. et al., "Surface Micromachined Angular Rate Sensor," A1995 SAE Conference, Paper No. 950538, pp. 77-83.

Putty, M.W. et al., "A Micromachined Vibrating Ring Gyroscope," 1994, Center for Integrated Sensors and Circuits, 213-220.

Skulski, J. et al., "Planar Resonator Sensor for Moisture Measurements," May 20-22, 1998, Microwaves and Radar, 12th International Conference on MIKON, 3:692-695.

T.K. Tang et al., "Silicon Bulk Micromachined Vibratory Gyroscope," Solid State Sensor and Actuator Workshop, Transducer Research Foundation, Hilton Head, South Carolina, Jun. 2-6, 1996, 6 pgs.

D. Wright et al., "The HRG Applied to a Satellite Attitude Reference System," Guidance and Control, American Astronautical Society, Advances in Astronautical Sciences, 1994, 86:1-13.

Wright t al., "The HRG Applied to a Satellite Attitude Reference System," Guidance and Control, AASAAS, 1994, 86:1-13.

Putty et al., "A Micromachined Vibrating Ring Gyroscope," Solid State Sensor and Actuator Workshop, Transducer Research Foundation, Hilton Head, 1994, pp. 213-220.

Tang et al., "A Packaged Silicon MEMS Vibratory Gyroscope for Microspacecraft," Proceedings IEEE, 10th Annual Int. Workshop on MEMS, Japan, 1997, pp. 500-505.

Barbour et al., "Micromechanical Silicon Instrument and Systems Development at Draper Laboratory," AIAA Guidance Navigation and Control Conference, 1996, Paper No. 96-3709.

Johnson et al., "Surface Micromachined Angular Rate Sensor," A1995 SAE Conference, Paper No. 950538, pp. 77-83.

Fujita et al., "Disk-shaped bulk micromachined gyroscope with vacuum sealing," Sensors and Actuators A:Physical, vol. 82, May 2000, pp. 198-204.

Skulski et al., "Planar resonator sensor for moisture measurements", Microwaves and Radar, 1998, MIKON '98, 12th International Conf., vol. 3, May 20-22, 1998, pp. 692-695.

* cited by examiner

MULTIPLE INTERNAL SEAL RIGHT MICRO-ELECTRO-MECHANICAL SYSTEM VACUUM PACKAGE

CROSS-REFERENCE TO RELATED APPLICATIONS

This application claims the benefit under 35 U.S.C. Section 119(e) of the following and commonly-assigned U.S. Provisional Application Ser. No. 60/477,463, filed on Jun. 10, 2003, by Ken J. Hayworth, Karl Y. Yee, Kirill V. Shcheglov, Youngsam Bae, Dean V. Wiberg, A. D. Challoner, Chris S. Peay, entitled "MULTIPLE INTERNAL SEAL RING MEMS VACUUM PACKAGE," which application is incorporated by reference herein.

This application is related to the following co-pending U.S. Utility and Provisional Patent Applications:

U.S. Utility patent application Ser. No. 10/639,134, filed Aug. 12, 2003, by Kirill V. Shcheglov and A. Dorian Challoner, entitled ISOLATED PLANAR GYROSCOPE WITH INTERNAL RADIAL SENSING AND ACTUATION, and U.S. Utility patent application Ser. No. 10/639,135, filed on Aug. 12, 2003, by Kirill V. Shcheglov, A. Dorian Challoner, Ken J. Hayworth, Dean V. Wiberg, and Karl Y. Yee, entitled INTEGRAL RESONATOR GYROSCOPE, and both of which applications claim the benefit under 35 U.S.C. § 119(e) of the following U.S. Provisional Patent Applications:

U.S. Provisional Patent Application Ser. No. 60/402,681, filed Aug. 12, 2002, by Kirill V. Shcheglov and A. Dorian Challoner, and entitled CYLINDER GYROSCOPE WITH INTEGRAL SENSING AND ACTUATION, and U.S. Provisional Patent Application Ser. No. 60/428,451, filed Nov. 22, 2002, by Kirill V. Shcheglov and A. Dorian Challoner, entitled DESIGN AND FABRICATION PROCESS FOR A NOVEL HIGH PERFORMANCE MESOGYRO, and all of which applications are incorporated by reference herein.

This application is related to the following co-pending U.S. Utility Patent Applications:

U.S. Utility patent application Ser. No. 10/370,953, filed Feb. 20, 2003, by A. Dorian Challoner and Kirill V. Shcheglov, entitled ISOLATED RESONATOR GYROSCOPE WITH A DRIVE AND SENSE FRAME, and which application is a continuation-in-part of U.S. Pat. No. 6,629,460, issued Oct. 7, 2003, to A. Dorian Challoner, entitled ISOLATED RESONATOR GYROSCOPE, and U.S. Utility patent application Ser. No. 10/423,459, filed Apr. 25, 2003, by A. Dorian Challoner and Kirill V. Shcheglov, entitled ISOLATED RESONATOR GYROSCOPE WITH ISOLATION TRIMMING USING A SECONDARY ELEMENT, and which application is a continuation-in-part of U.S. Pat. No. 6,629,460, issued Oct. 7, 2003, to A. Dorian Challoner, entitled ISOLATED RESONATOR GYROSCOPE, and U.S. Utility patent application Ser. No. 10/410,744, filed Apr. 10, 2003, by A. Dorian Challoner and Kirill V. Shcheglov, entitled ISOLATED RESONATOR GYROSCOPE WITH COMPACT FLEXURES, and which application is a continuation-in-part of U.S. Pat. No. 6,629,460, issued Oct. 7, 2003, to A. Dorian Challoner, entitled ISOLATED RESONATOR GYROSCOPE, and all of which applications and patents are incorporated by reference herein.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

The present invention relates to vacuum packages, and particularly to multiple internal seal ring (MISR) micro-electro-mechanical (MEMS) vacuum packages.

2. Description of the Related Art

It is well known in the art to fabricate micro-electro-mechanical system (MEMS) devices. MEMS devices typically integrate both electronic and mechanical elements on a semiconductor wafer using semiconductor fabrication techniques. Generally, the electronic and mechanical elements are fabricated using a variety of integrated circuit (IC) processing and micromachining techniques, respectively.

In the fabrication of MEMS devices, it is not unusual to package or "cap" such devices to prevent damage or contamination to the MEMS devices. Often, the cap comprises a capping plate fabricated from a capping wafer that is bonded to a base plate before the base plate wafer is diced or singulated into individual devices. The capping plate thus hermetically seals the MEMS devices within the base plate.

Even though sealed by the capping plate, the MEMS devices require electrical connection to external circuits. However, the traces used for connection may create gaps where the capping plate and base plate are bonded. Generally, the surfaces where the capping plate wafer and the base plate wafer are bonded must be ultra-flat, i.e., polished. This flatness requirement is difficult to meet if additional processing steps are required for bringing electrical feed-through metal traces out through the bonded surfaces. Specifically, bringing electrical wires out through the bonded surfaces requires metal patterning and oxide growth on the wafers' surfaces. Achieving a bond or seal on top of these uneven surfaces is much more difficult.

Accordingly, what is needed, therefore, is an improved method for sealing and packaging MEMS devices that allows for electrical connection to external circuits.

SUMMARY OF THE INVENTION

To minimize the limitations in the related art described above, and to minimize other limitations that will become apparent upon reading and understanding the present specification, the present invention discloses a Multiple Internal Seal Ring (MISR) Micro-Electro-Mechanical System (MEMS) vacuum package that hermetically seals MEMS devices using MISR. The method bonds a capping plate having metal seal rings to a base plate having metal seal rings by wafer bonding the capping plate wafer to the base plate wafer. Bulk electrodes may be used to provide conductive paths between the seal rings on the base plate and the capping plate. All seals are made using only metal-to-metal seal rings deposited on the polished surfaces of the base plate and capping plate wafers. However, multiple electrical feed-through metal traces are provided by fabricating via holes through the capping plate for electrical connection from the outside of the package through the via-holes to the inside of the package. Each metal seal ring serves the dual purposes of hermetic sealing and providing the electrical feed-through metal trace.

BRIEF DESCRIPTION OF THE DRAWINGS

Referring now to the drawings in which like reference numbers represent corresponding parts throughout:

FIG. 1C shows the final sealed multiple internal seal ring vacuum package;

FIGS. 2A, 2B and 2C are perspective views of the results of wafer scale processing of the vacuum package before singulation, wherein FIG. 2A illustrates bonded wafers containing a plurality of micro-electro-mechanical system devices that are vacuum sealed simultaneously during wafer bonding of a wafer containing the base plates and a wafer containing the capping plates, FIG. 2B is a magnified view of a portion of the bonded wafers, and FIG. 2C is a magnified view of the final sealed multiple internal seal ring vacuum package comprised of the joined base plate and capping plate found in the portion of the bonded wafers.

FIGS. 7A and 7B illustrate a comparison of the multiple internal seal ring vacuum package design for the two-wafer (surface processed micro-electro-mechanical system device) and three-wafer (bulk processed micro-electro-mechanical system device) designs, wherein FIG. 7A is a partially-cutaway view of the two-wafer multiple internal seal ring vacuum package and FIG. 7B is a partially-cutaway view of the three-wafer multiple internal seal ring vacuum package;

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention discloses a method of vacuum sealing or hermetically sealing Micro-Electro-Mechanical Systems (MEMS) devices using MISR at a wafer level before singulation or dicing. The method bonds a capping plate having metal seal rings to a base plate having metal seal rings by wafer bonding the capping plate wafer to the base plate wafer. Bulk electrodes may be used to provide conductive paths between the seal rings on the base plate and the capping plate. This method works best if the bonding surface of the base plate wafer and the bonding surface of the capping plate wafer are ultra-flat (i.e., polished) before the metal seal rings are deposited on each surface.

This flatness requirement is difficult to meet if additional processing steps are required for bringing electrical feed-through metal traces out underneath the seal rings. Specifically, bringing electrical feed-through metal traces out under the seal rings requires metal patterning and oxide growth on the wafer's surface, which results in an uneven surface. Achieving a metal-to-metal vacuum seal on top of this uneven surface is much more difficult than achieving a metal-to-metal vacuum seal between polished, ultra-flat surfaces.

All seals are made using only metal-to-metal seal rings deposited on the polished surfaces of the base plate wafer and the capping plate wafer. However, the package still enables multiple electrical feed-through metal traces by fabricating multiple via holes through the capping plate for electrical connection from the outside of the vacuum package through the via-holes to the inside of the vacuum package. Each metal seal ring serves the dual purposes of hermetic sealing and providing an electrical feed-through metal trace.

Figure 1C:
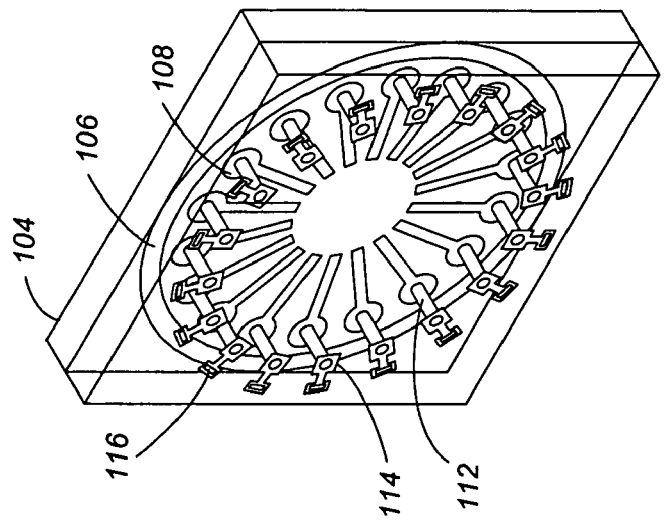
FIGS. 1A, 1B and 1C are perspective views of an embodiment of the present invention, wherein FIG. 1A comprises a base plate, FIG. 1B comprises a capping plate
Figure 1B:
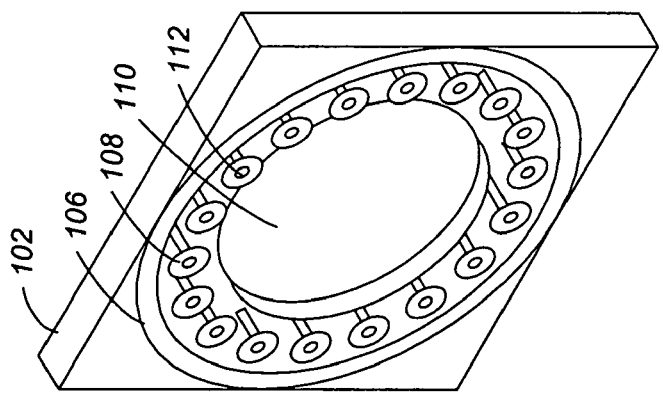
Figure 1A:
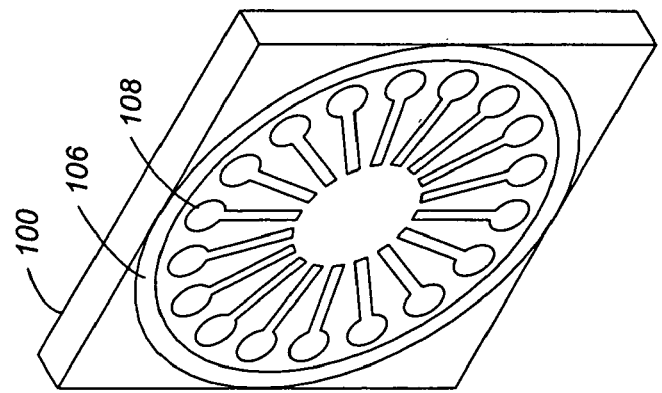

FIGS. 1A, 1B and 1C are perspective views of an embodiment of the present invention, wherein FIG. 1A comprises a base plate 100, FIG. 1B comprises a capping plate 102 and FIG. 1C shows a final, vacuum-sealed, MISR device package 104 comprised of the bonded base plate 100 and capping plate 102, wherein the capping plate 102 is flipped before being bonded to the base plate 100, and the capping plate 102 is shown semi-transparently to better illustrate the components of the package 104. The base plate 100 and the capping plate 102 each include a large periphery seal ring 106 that is used to create one large metal-to-metal seal surrounding the periphery of the package 104 when the base plate 100 and the capping plate 102 are bonded together. In addition, the base plate 100 and the capping plate 102 each include a plurality of small internal seal rings 108. The seal rings 108 of the base plate 100 each provide an independent electrical path from a cavity 110 of the capping plate 102 where the MEMS device (not shown) resides outward towards the periphery of the package 104, but not crossing the seal ring 106. Each of the seal rings 108 of the capping plate 102 surround and electrically connect to one of a plurality of via holes 112 on a bottom surface of the capping plate 102. Each via hole 112 extends through the capping plate 102 to a top surface of the capping plate 102, where the via hole 112 electrically connects to an electrical trace pattern 114 and solder bump 116 on the top surface of the capping plate 102. The package 104 is sealed by compression bonding of the metal-to-metal seal rings 106 and 108, which is followed by singulation to separate the multiple packages 104 on the bonded wafers.

Figures 2A, 2B, 2C:
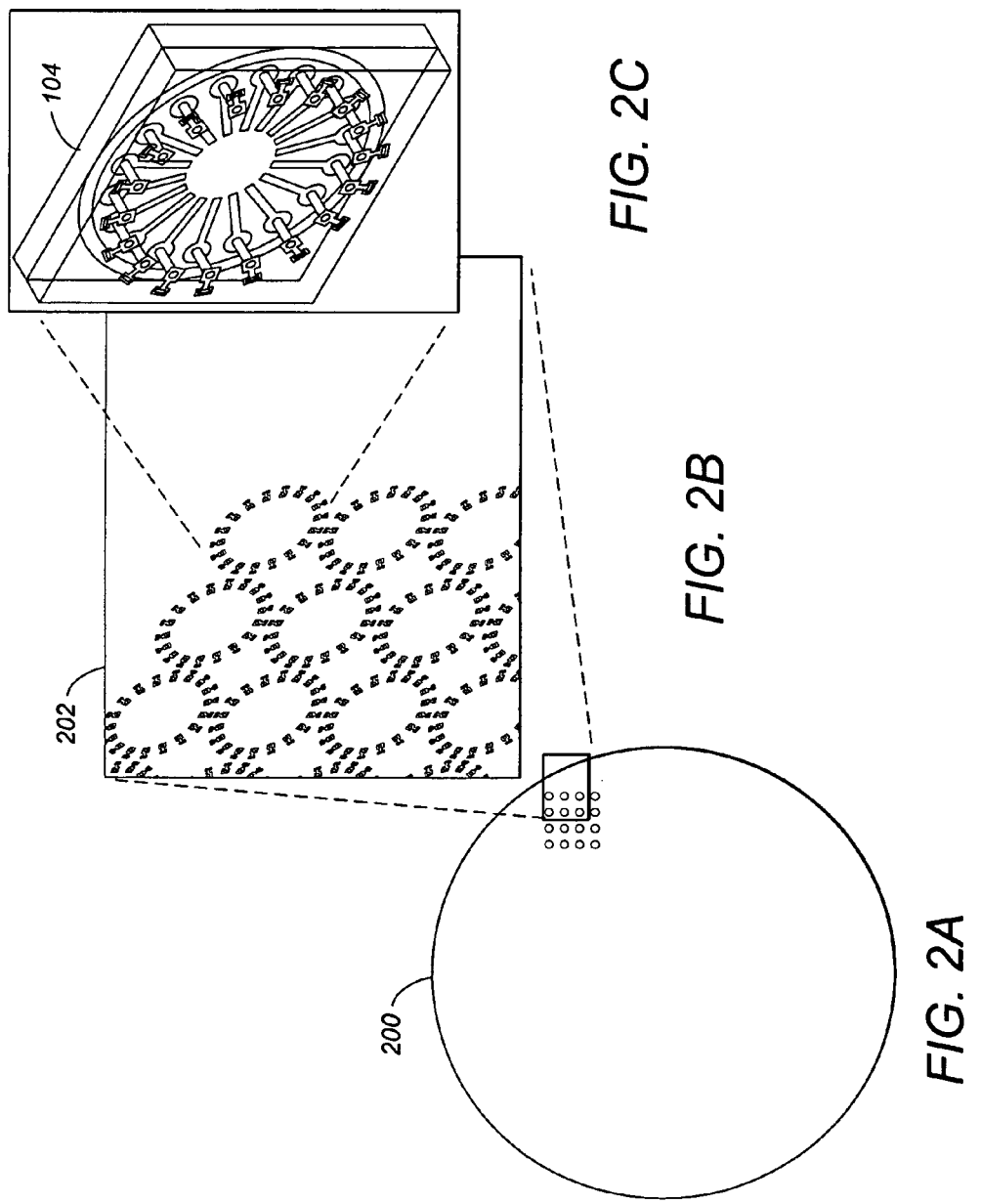

Although FIGS. 1A, 1B and 1C illustrate only a single package 104, the potential benefits (cost savings and simplified, more reliable manufacturing process) of the MISR device package 104 are most dramatic when performed by wafer scale processing. FIGS. 2A, 2B and 2C are perspective views of the results of wafer scale processing of the package 104 before singulation, wherein FIG. 2A illustrates bonded wafers 200 containing a plurality of MEMS devices that are sealed simultaneously during wafer bonding of a wafer containing the base plates 100 and a wafer containing the capping plates 102, FIG. 2B is a magnified view of a portion 202 of the bonded wafers 200, and FIG. 2C is a magnified view of final, vacuum-sealed, MISR device package 104 comprised of the joined base plate 100 and capping plate 102 found in the portion 202 of the bonded wafers 200.

Process Steps

There are two general MEMS processing paradigms to which the package is aimed.

Figure 3:
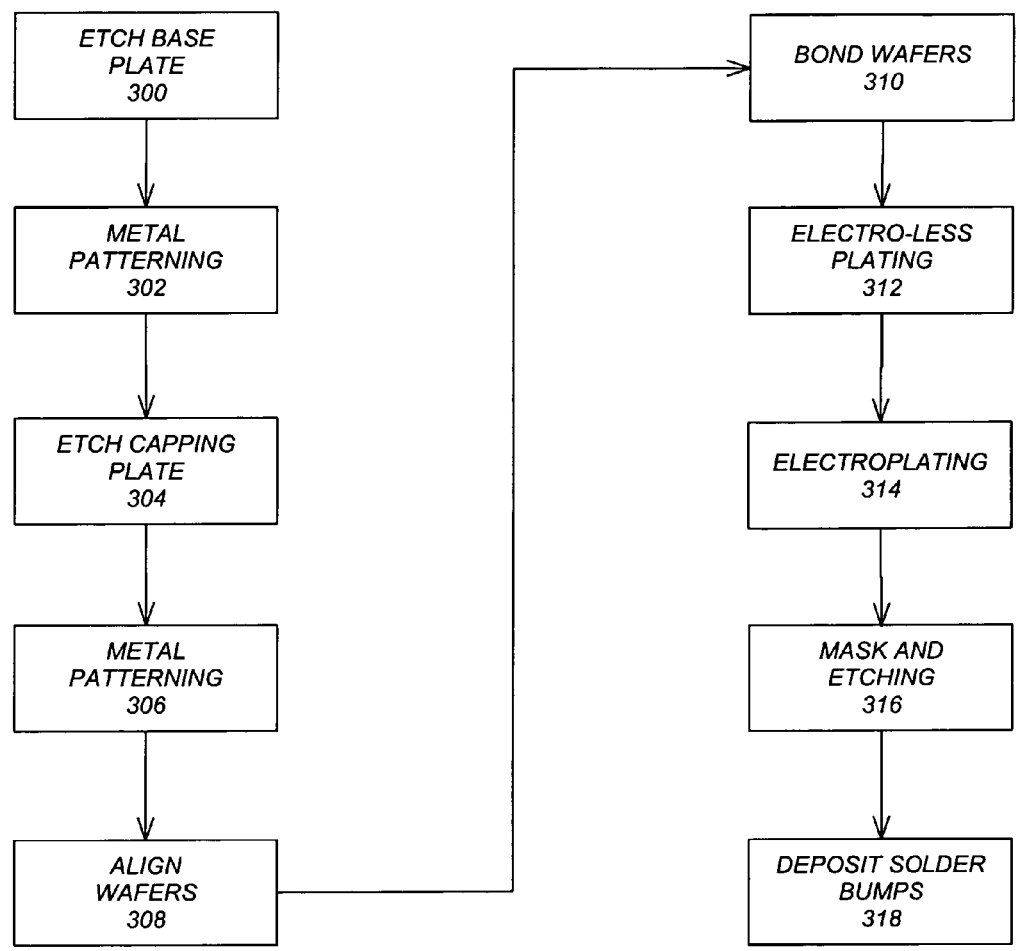
FIG. 3 is a flowchart that illustrates the steps of a first general micro-electro-mechanical system processing paradigm for a surface processed micro-electro-mechanical system device etched directly from the base plate wafer that is vacuum packaged using the capping plate wafer.

In the first general MEMS processing paradigm, a surface-processed MEMS device is packaged according to the steps outlined in FIG. 3 and illustrated in FIGS. 4A-4F, wherein FIGS. 4A-4F show a base plate 400, capping plate 402, package 404, large external seal rings 406, small internal seal rings 408, etched cavity 410 of the capping plate 402, etched via holes 412 in the capping plate 402, electrical trace patterns 414 and solder bumps 416.

Figure 4A:
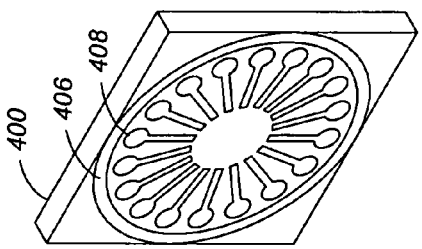
FIGS. 4A-4F illustrate the results of the flowchart of FIG. 3.

Blocks 300 and 302 of FIG. 3 illustrate the processing of the base plate 400, which is generally comprised of silicon or other semiconducting material, and which is illustrated in FIG. 4A. Block 300 represents the etching of the base plate 400 in a manner that avoids etching under seal rings 406 and 408. Block 302 represents the metal patterning of the seal rings 406 and 408.

Figure 4B:
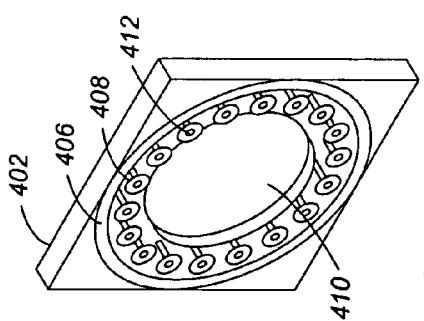

Blocks 304 and 306 of FIG. 3 illustrate the processing of the capping plate 402, which is generally comprised of glass or other non-conducting material, and which is illustrated in FIG. 4B. Block 304 represents the etching of the via holes 412 and cavity 410 (if needed) in the capping plate 402. Block 306 represents the metal patterning of the seal rings 406 and 408 on the bottom surface of the capping plate 402.

Figure 4C:
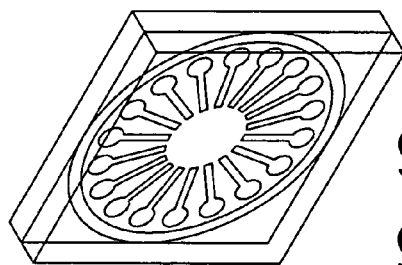

Blocks 308 and 310 of FIG. 3 illustrate the bonding of the base plate 400 and the capping plate 402, which is illustrated in FIG. 4C. Block 308 represents the aligning of the base plate 400 and capping plate 402 wafers, which includes the aligning of the seal rings 406 and 408 of the base plate 400 and capping plate 402. Block 310 represents the bonding of the base plate 400 and capping plate 402 wafers using heat and pressure in an evacuated chamber.

Figure 4D:
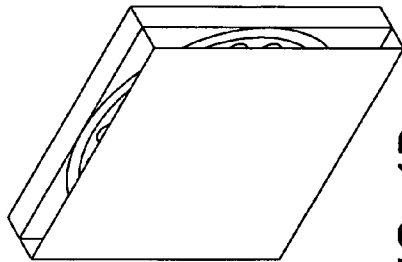

Blocks 312 and 314 of FIG. 3 illustrate the plating of the capping plate 402, which is illustrated in FIG. 4D. Block 312 represents the electro-less plating of a thin metal layer on the top surface of the capping plate 402, including inside the via holes 412. Block 314 represents the electroplating of a thicker metal layer on top of the thin metal layer.

Figure 4E:
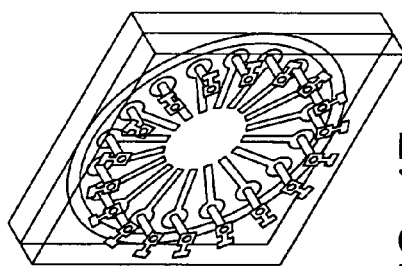
Figure 4F:
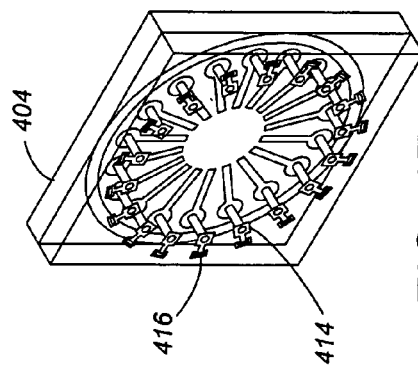

Block 316 of FIG. 3 illustrates the patterning of the electrical trace patterns 414 on the surface of the capping plate 402, which is illustrated in FIG. 4E. Block 316 represents the masking and etching of the electrical trace patterns 414 on the top surface of the capping plate 402.

Block 318 of FIG. 3 illustrates the final processing prior to singulation, which is illustrated in FIG. 4E. Block 318 represents the depositing of the solder bumps 416 at one end of the electrical trace patterns 414 etched on the top surface of the capping plate 402, in order to complete the package 404.

Figure 5:
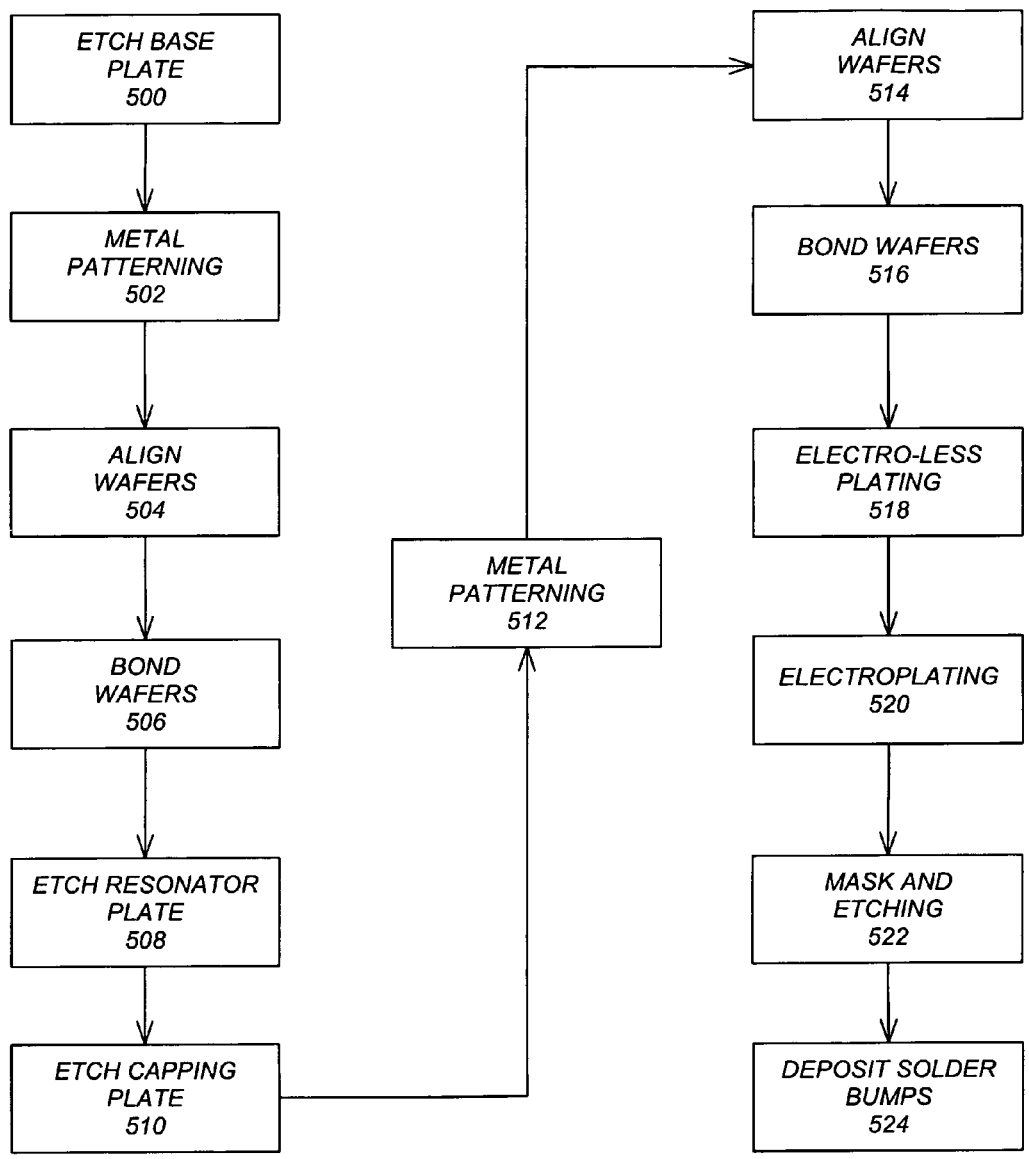
FIG. 5 is a flowchart that illustrates the steps of a second general micro-electro-mechanical system processing paradigm for a two-wafer bulk silicon etched micro-electro-mechanical system device etched from a bonded base plate wafer and resonator wafer that is vacuum packaged using the capping plate wafer.

In the second general MEMS processing paradigm, a two-wafer bulk-silicon-etched MEMS device is packaged according to the steps outlined in FIG. 5 and illustrated in FIGS. 6A-6G, wherein FIGS. 6A-6G show a base plate 600, capping plate 602, package 604, large external seal rings 606, small internal seal rings 608, etched cavity 610 of the capping plate 602, etched via holes 612 in the capping plate 602, electrical trace patterns 614 and solder bumps 616. In this embodiment, there is also a resonator plate 618 that is used to create a MEMS device resonator (not shown), wherein the resonator plate 618 includes bulk electrodes 620 that provide conductive paths between the seal rings 606 and 608 on both the base plate 600 and capping plate 602.

Figure 6D:
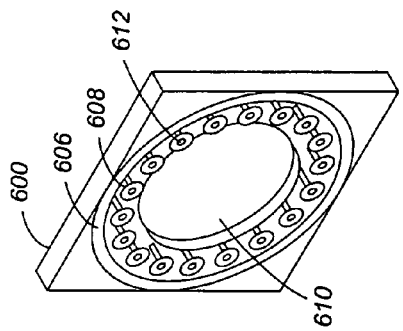
FIGS. 6A-6G illustrate the results of the flowchart of FIG. 5.
Figure 6G:
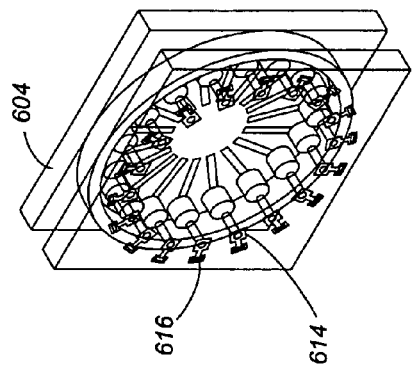
Figure 6C:
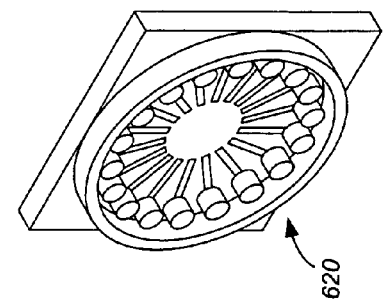
Figure 6B:
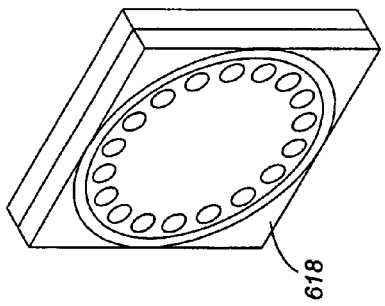
Figure 6F:
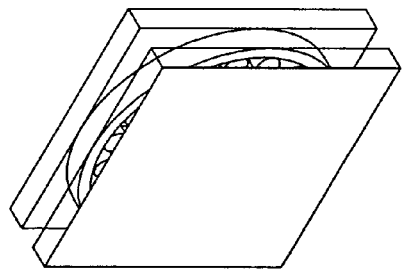
Figure 6A:
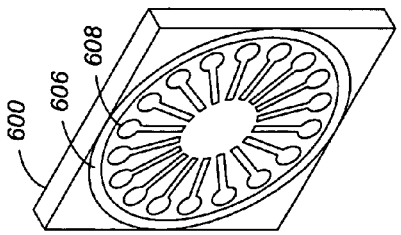

Blocks 500 and 502 of FIG. 5 illustrate the processing of the base plate 600, which is generally comprised of silicon or other semiconducting material, and which is illustrated in FIG. 6A. Block 500 represents the etching of the base plate 600 in a manner that avoids etching under seal rings 606 and 608. Block 502 represents the metal patterning of the seal rings 606 and 608.

Blocks 504 and 506 of FIG. 5 illustrate the vacuum bonding of the base plate 600 and the resonator plate 616, which is illustrated in FIG. 6B. Block 504 represents the aligning of the base plate 602 and resonator plate 616 wafers. Block 506 represents the bonding of the base plate 602 and resonator plate 618 wafers using heat and pressure in an evacuated chamber.

Block 508 of FIG. 5 illustrates the etching of the resonator plate 616, which is generally comprised of silicon or other semiconducting material, and which is illustrated in FIG. 6C. Block 508 represents the etching of the MEMS resonator (not shown) and bulk electrodes 620, wherein the doped silicon or a metalization of the resonator plate 618 provides conductive paths for the electrodes 620.

Blocks 510 and 512 of FIG. 5 illustrate the processing of the capping plate 602, which is preferably comprised of glass or other non-conducting material, and which is illustrated in FIG. 6D. Block 510 represents the etching of the via holes 612 and cavity 610 (if needed) of the capping plate 602. Block 512 represents the metal patterning of the seal rings 606 and 608 on the bottom surface of the capping plate 602.

Figure 6E:
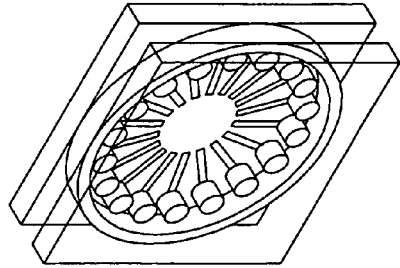

Blocks 514 and 516 of FIG. 5 illustrate the bonding of the resonator plate 616 and capping plate 602 wafers, which is illustrated in FIG. 6E. Block 514 represents the aligning of the resonator plate 618 and capping plate 602 wafers, and more specifically, the aligning of the bulk electrodes 620 of the resonator plate 618 with the seal rings 606 and 608 of the capping plate 602. Block 516 represents the bonding of the resonator plate 618 and capping plate 602 wafers using heat and pressure in an evacuated chamber.

Blocks 518 and 520 of FIG. 5 illustrate the metal plating of the capping plate 602, which is illustrated in FIG. 6F. Block 518 represents the electro-less plating of a thin metal layer on a top surface of the capping plate 602 including inside the via holes 612. Block 520 represents the electroplating of a thicker metal layer on the thin metal layer.

Blocks 522 and 524 of FIG. 5 illustrate the final processing, which is illustrated in FIG. 6G. Block 522 represents the masking and etching of the electrical trace pattern 614 on the top surface of the capping plate 602. Block 524 represents the depositing of the solder bumps 616 at one end of the electrical trace pattern 614 etched on the top surface of the capping plate 602, in order to complete the package 604.

Figure 7B:
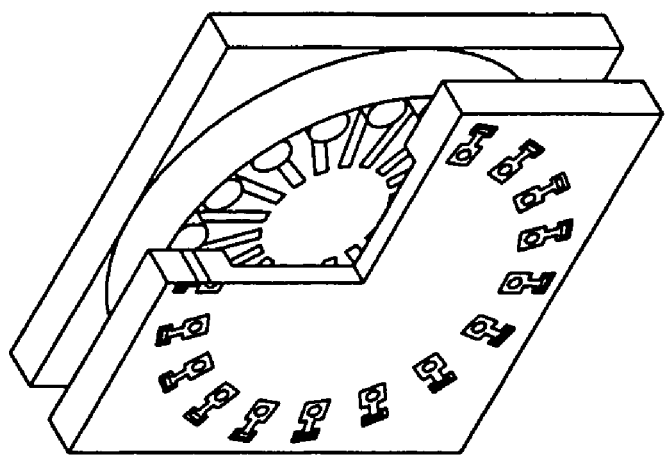
Figure 7A:
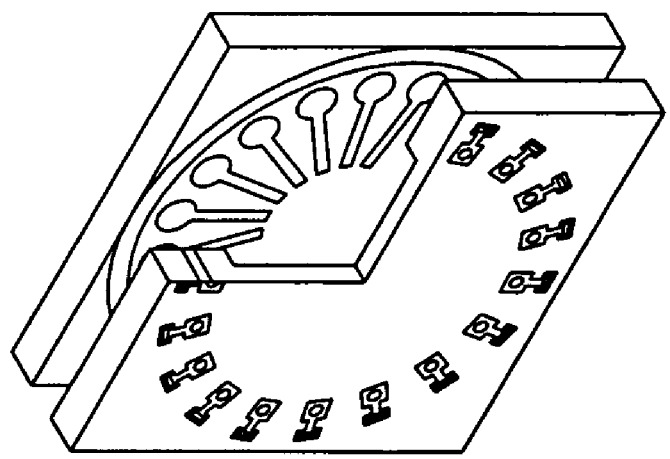

A comparison of the MISR vacuum package design for the two-wafer (surface processed MEMS device) and three-wafer (two-wafer bulk-silicon-etched MEMS device) are shown in the cutaway views of FIGS. 7A and 7B, wherein FIG. 7A is a partially-cutaway view of the two-wafer MISR package and FIG. 7B is a partially-cutaway view of the three-wafer MISR package.

The three-wafer MISR package of FIG. 5, FIGS. 6A-6G and 7B may be used to vacuum package a planar gyroscope described in co-pending U.S. Utility patent application Ser. No. 10/639,134, filed Aug. 12, 2003, by Kirill V. Shcheglov and A. Dorian Challoner, entitled ISOLATED PLANAR GYROSCOPE WITH INTERNAL RADIAL SENSING AND ACTUATION, and which application is incorporated by reference herein. However, certain modifications to the package are required.

The planar gyroscope has a large total number of electrodes (48 individual electrode elements). If all of these electrodes were brought out of the package through individual seal rings, the increase in total die area would be prohibitive. This is because a "sealing bulk electrode" must have a large enough diameter to support a good vacuum seal. To avoid having 48 sealing bulk electrodes, electrical connections crisscrossing inside the package are used to connect common sets of electrodes. In the planar gyroscope design, the 48 individual electrodes are reduced to only 12 electrode sets requiring individual package feed-throughs. Thus only 12 sealing bulk electrodes are needed in the final design, and these easily fit into the unused corners of the square planar package.

The internal wire routing (connecting the 48 individual electrodes into 12 sets) requires crossing some wires, and thus requires at least two metal routing layers. The design of the MISR package allows this to be achieved without requiring an extra metalization and oxide growth process (which would interfere with the surface flatness required for good sealing). This crisscrossing of wires is achieved by using small "bridging bulk electrodes" to act as vias between the base plate's metal patterning and the capping plate's internal metal pattern. In the current design, 48 of these small bridging bulk electrodes are used (to connect each individual electrode with a circular shorting pattern on the capping plate) and 12 sealing bulk electrodes are used to provide the final package feed-throughs for each electrode set.

Figure 8:
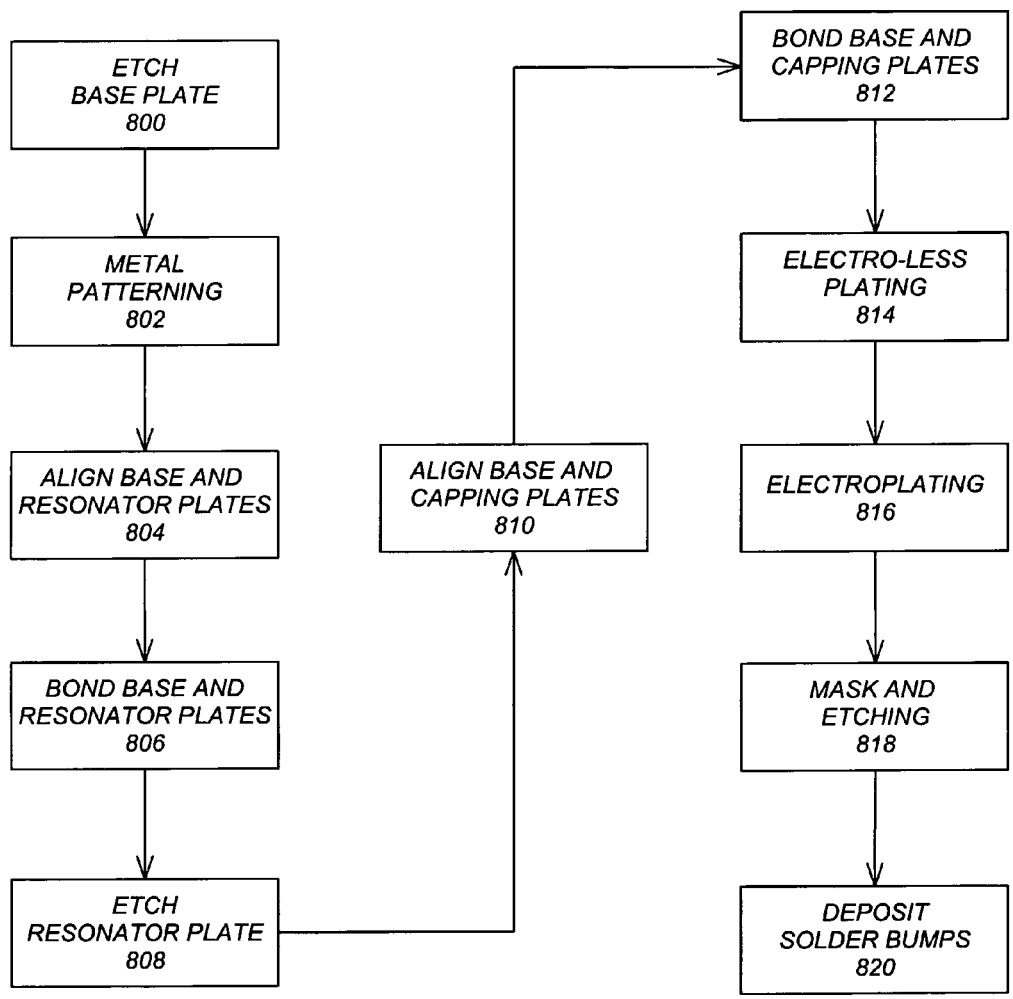
FIG. 8 is a flowchart that illustrates the steps of the three-wafer design packaging a planar gyroscope.

As noted above, the processing steps used to create such an MISR package are generally reflected in FIG. 5 and FIGS. 6A-6G. However, some of the steps are further described in FIG. 8 and illustrated as cross-sectional views in FIGS. 9A-9I.

Figure 9A:
FIGS. 9A-9I illustrate the results of the flowchart of FIG. 8.

Block 800 represents the etching of the base plate 900, which is illustrated in FIG. 9A.

Figure 9B:
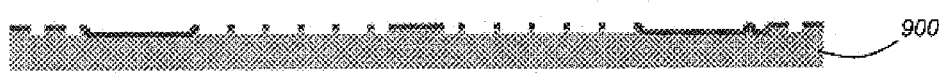

Block 802 represents the metal patterning of the base plate 900, which is illustrated in FIG. 9B.

Figure 9C:
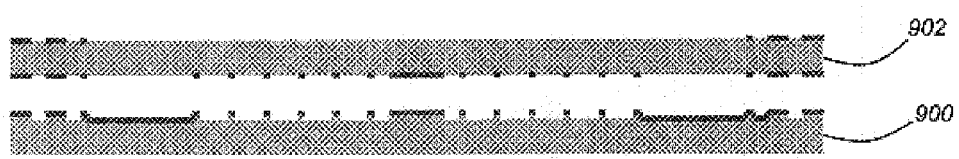

Block 804 represents the aligning of the base plate 900 and resonator plate 902, which was processed separately, and which is illustrated in FIG. 9C.

Figure 9D:

Block 806 represents the bonding of the base plate 900 and resonator plate 902, which is illustrated in FIG. 9D.

Figure 9E:

Block 808 represents the deep silicon etching of the resonator plate 902, which is illustrated in FIG. 9E.

Figure 9F:
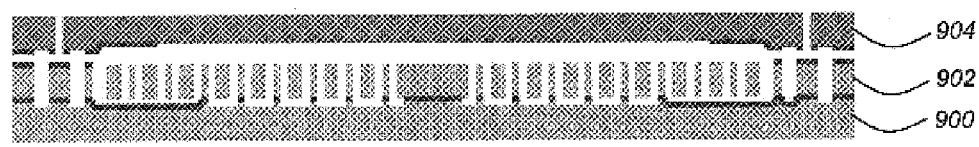

Block 810 represents the aligning of the base plate 900 and capping plate 904, which was processed separately, and which is illustrated in FIG. 9F.

Figure 9G:
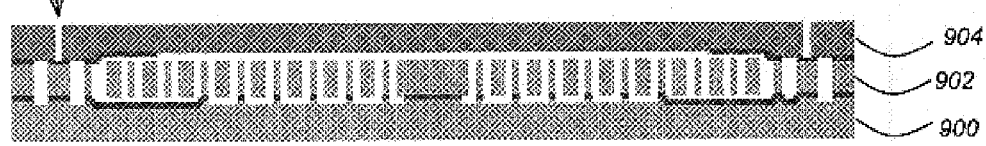

Block 812 represents the bonding of the base plate 900 and capping plate 904, which is illustrated in FIG. 9G.

Figure 9H:
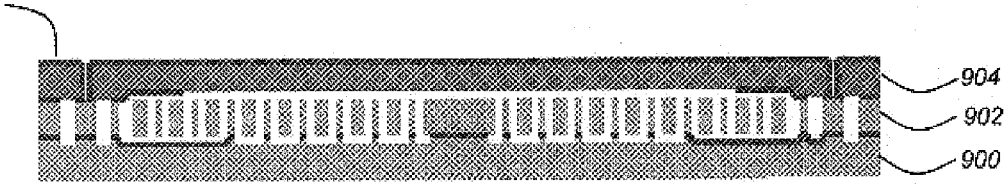

Block 814 represents the electro-less plating of the capping plate 904, including its via holes 906, which is illustrated in FIG. 9H.

Block 816 represents the electroplating of the capping plate 904, including its via holes 906, which is also illustrated in FIG. 9H.

Figure 9I:
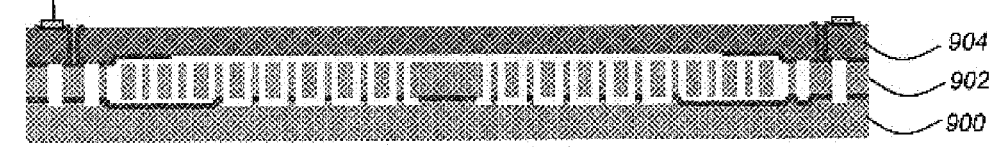

Block 818 represents the masking and etching of the electrical trace pattern 908 on the top surface of the capping plate 904, which is illustrated in FIG. 9I.

Block 820 represents the depositing of the solder bumps 910 at one end of the electrical trace pattern 908 etched on the top surface of the capping plate 904, which is also illustrated in FIG. 9I.

CONCLUSION

This concludes the description of the preferred embodiment of the present invention. The following describes some alternative embodiments for accomplishing the present invention.

For example, although specific structures are described in this specification, other structures could be used as well without departing from the scope of the present invention. Variations in the components used in the present invention are possible.

Further, the specific logic or steps performed by the present invention are described for illustration purposes only, and other logic or steps could be used as well. Many variations of the logic and steps performed by the present invention are possible.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device package, comprising:
a capping plate including at least one periphery seal ring and at least one internal seal ring bonded to a base plate including at least one periphery seal ring and at least one internal seal ring;
wherein the periphery seal rings of the capping plate and base plate create a metal-to-metal seal surrounding the periphery of the package when the capping plate and the base plate are bonded together,
the internal seal rings of the capping plate electrically connect to a plurality of via holes extending through to an external surface of the capping plate,
the internal seal rings of the base plate provide an independent electrical path from a cavity in the capping plate outward towards a periphery of the base plate, and
the internal seal rings of the capping plate and the base plate create a metal-to-metal seal within the periphery of the package when the base plate and the capping plate are bonded together.

2. The device package of claim 1, wherein each seal ring serves the dual purposes of hermetic sealing and providing an electrical feed-through metal trace.

3. The device package of claim 1, wherein the device package is sealed by compression bonding of the seal rings of the capping plate and base plate.

4. The device package of claim 1, wherein the seal rings of the capping plate and the seal rings of the base plate provide a metal-to-metal seal between the base plate and the capping plate, when the base plate and the capping plate are bonded together.

5. The device package of claim 1, wherein the via holes through the capping plate provide electrical connection from outside the device package through the via-holes to inside the device package.

6. The device package of claim 1, wherein each via hole extends through the capping plate from a bottom surface to a top surface of the capping plate.

7. The device package of claim 1, wherein each via hole electrically connects to an electrical trace pattern on the top surface of the capping plate.

8. The device package of claim 1, wherein a plurality of the capping plates are fabricated on a capping plate wafer and a plurality of the base plates are fabricated on a base plate wafer.

9. The device package of claim 1, wherein the capping plate wafer is bonded to the base plate wafer.

10. The device package of claim 1, wherein bulk electrodes provide conductive paths between the seal rings on the base plate and the capping plate.

11. The device package of claim 1, wherein the bulk electrodes are fabricated from a resonator plate wafer bonded to the base plate wafer.

12. A device packaged using a method comprising the steps of:
 (a) metal patterning of at least one seal ring on a base plate;
 (b) etching of via holes in a capping plate;
 (c) metal patterning of at least one seal ring on a bottom surface of the capping plate;
 (d) aligning of the base plate and capping plate;
 (e) bonding of the base plate and capping plate;
 (f) electro-less plating of a thin metal layer on a top surface of the capping plate, including inside the via holes;
 (g) electroplating of a thicker metal layer on top of the thin metal layer; and
 (h) masking and etching of electrical trace patterns on the top surface of the capping plate.

13. The device of claim 12, wherein the device comprises a surface-processed micro-electro-mechanical system (MEMS) device etched directly from the base plate wafer.

14. A device packaged using a method comprising the steps of:
 (a) metal patterning of at least one seal ring on a base plate;
 (b) aligning of the base plate and a resonator plate;
 (c) bonding of the base plate and resonator plate using heat and pressure in an evacuated chamber;
 (d) etching of bulk electrodes on the resonator plate, wherein the doped silicon or a metalization of the resonator plate provides a conductive path for the electrodes;
 (e) etching of at least one via hole in a capping plate;
 (f) metal patterning of at least one seal ring on a bottom surface of the capping plate;
 (g) aligning of the resonator plate and capping plate, and more specifically, the aligning of the bulk electrodes of the resonator plate with the seal rings of the capping plate;
 (h) bonding of the of the resonator plate and capping plate using heat and pressure in an evacuated chamber;
 (i) electro-less plating of a thin metal layer on a top surface of the capping plate including inside the via holes;
 (j) electroplating of a thicker metal layer on the thin metal layer;
 (k) masking and etching of an electrical trace pattern on the top surface of the capping plate.

15. The device of claim 14, wherein the device comprises a two-wafer bulksilicon-etched micro-electro-mechanical system (MEMS) device etched from the bonded base plate wafer and resonator wafer.

* * * * *